(12) United States Patent
Ryu

(10) Patent No.: US 8,816,668 B2
(45) Date of Patent: Aug. 26, 2014

(54) SEMICONDUCTOR CIRCUIT FOR OUTPUTTING REFERENCE VOLTAGES

(75) Inventor: Je Il Ryu, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 239 days.

(21) Appl. No.: 13/411,176

(22) Filed: Mar. 2, 2012

(65) Prior Publication Data
US 2013/0049729 A1 Feb. 28, 2013

(30) Foreign Application Priority Data
Aug. 22, 2011 (KR) .................. 10-2011-0083572

(51) Int. Cl.
*G05F 1/567* (2006.01)
(52) U.S. Cl.
USPC .......................................... 323/314; 323/354
(58) Field of Classification Search
CPC ......... G05F 1/462; G05F 1/463; G05F 1/567; G05F 1/63; G05F 1/648
USPC .................. 323/354, 352, 353, 314, 273, 279
See application file for complete search history.

(56) References Cited

U.S. PATENT DOCUMENTS 7,633,333 B2 * 12/2009 Ma ................................ 327/539

FOREIGN PATENT DOCUMENTS

KR 1020070115143 A 12/2007

* cited by examiner

*Primary Examiner* — Harry Behm
*Assistant Examiner* — Matthew Grubb
(74) *Attorney, Agent, or Firm* — William Park & Associates Ltd.

(57) ABSTRACT

A semiconductor circuit includes a control signal generation circuit configured to generate control signals in response to a voltage characteristic determination signal and a reference voltage generation circuit configured to output a main reference voltage, having one of a first characteristic of being proportional to temperature, a second characteristic of being constant irrespective of temperature, and a third characteristic of being inversely proportional to temperature, in response to the control signals.

29 Claims, 3 Drawing Sheets

SEMICONDUCTOR CIRCUIT FOR OUTPUTTING REFERENCE VOLTAGES

CROSS-REFERENCE TO RELATED APPLICATION

Priority is claimed to Korean patent application number 10-2011-0083572 filed on Aug. 22, 2011, the entire disclosure of which is incorporated by reference.

BACKGROUND

Exemplary embodiments relate to a semiconductor circuit and, more particularly, to a semiconductor circuit for outputting reference voltages.

In order for a semiconductor circuit to operate, a reference voltage is necessary. Typically, the reference voltage must have a constant level irrespective of factors in a manufacturing process, a change in power source voltage, and a change in temperature. Generally, a reference voltage having a PTAT (proportional to absolute temperature) component or a CTAT (complementary to absolute temperature) component is generated, if necessary.

In order to generate the reference voltage not related to temperature, the reference voltage having the PTAT component, and the reference voltage having the CTAT component as described above, three reference voltage generation circuits are necessary. For this reason, the area occupied by the reference voltage generation circuits is increased.

BRIEF SUMMARY

Exemplary embodiments relate to a semiconductor circuit including a reference voltage generation circuit capable of generating a reference voltage not related to temperature, a reference voltage having a PTAT component, and a reference voltage having a CTAT component, if necessary.

A semiconductor circuit according to an embodiment of the invention includes a bandgap reference circuit configured to generate a first voltage that is constant irrespective of temperature; an amplifier circuit such as, for example, a differential amplifier or an op amp, configured to generate a bias signal based on the first voltage and a division voltage; a transfer circuit, which may be, for example, a PMOS transistor, configured to transfer a power source voltage to an output terminal in response to the bias signal; a diode circuit, which may be, for example, a diode-coupled NMOS transistor, between the output terminal and a first node; and first and second resistance circuits coupled in series between the first node and a ground node, wherein each resistance circuit is configured to have its resistance value varied in response to control signals in order to control current flowing through the transfer circuit.

A semiconductor circuit according to another aspect of the present disclosure includes a control signal generation circuit configured to generate control signals in response to a voltage characteristic determination signal and a reference voltage generation circuit configured to output a main reference voltage having one of a first characteristic of being proportional to temperature, a second characteristic of being constant irrespective of temperature, and a third characteristic of being inversely proportional to temperature, in response to the control signals.

The reference voltage generation circuit may include an op amp configured to have a first voltage inputted to an inverting input terminal and a second voltage inputted to a non-inverting input terminal; a voltage supply circuit configured to operate in response to an output voltage of the op amp and coupled between a power source voltage terminal and an output node from which the main reference voltage is outputted; and a voltage characteristic determination circuit unit configured to output the second voltage to determine a characteristic of the main reference voltage as one of the first to third characteristics in response to the control signals.

Furthermore, the reference voltage generation circuit includes an amplifier circuit configured to have a bandgap reference voltage inputted to a non-inverting input terminal; a transistor circuit coupled between a power source voltage terminal and an output node from which the main reference voltage is outputted and which is configured to operate in response to an output voltage of the op amp; a diode circuit coupled to the output node; a first resistance circuit coupled between the diode circuit and a non-inverting input terminal of the amplifier circuit and configured to have a resistance value varying in response to the control signals; and a second resistance circuit coupled between a ground terminal and the non-inverting input terminal of the amplifier circuit and configured to have a resistance value varying in response to the control signals.

DESCRIPTION OF EMBODIMENTS

Some exemplary embodiments of the present disclosure will be described in detail with reference to the accompanying drawings. The figures are provided to allow those having ordinary skill in the art to understand the scope of the embodiments of the disclosure.

Figure 1:
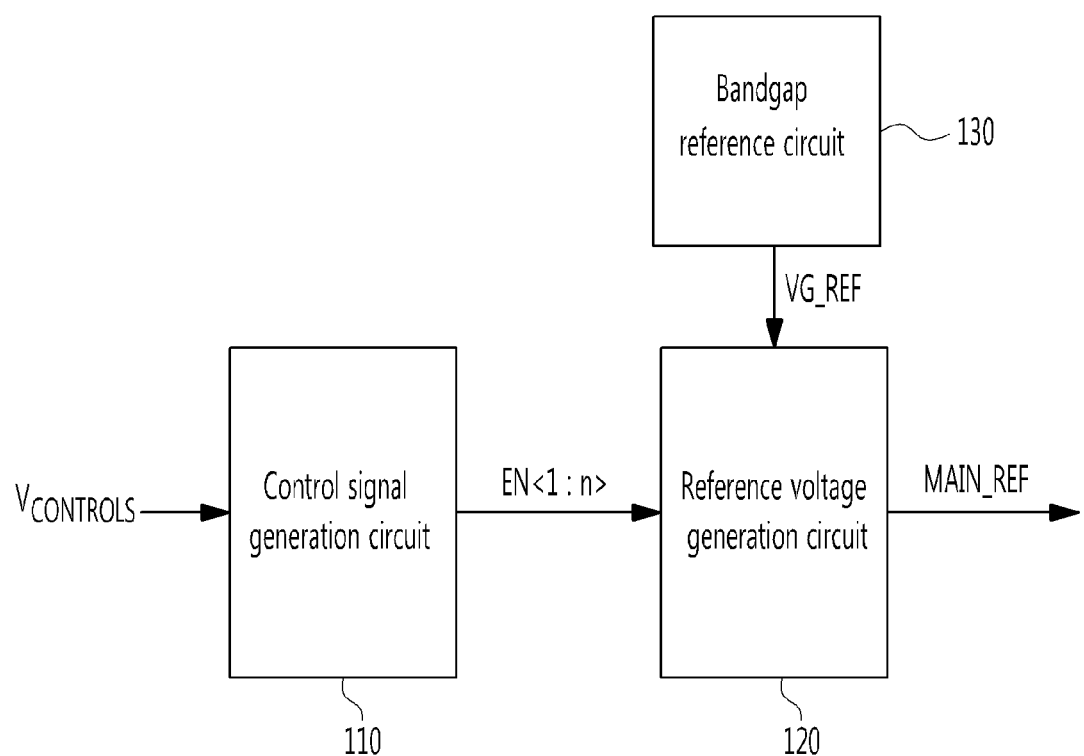
FIG. 1 is a block diagram illustrating an exemplary semiconductor circuit according to an embodiment of this disclosure.

FIG. 1 is a block diagram illustrating an exemplary semiconductor circuit according to an embodiment of this disclosure.

Referring to FIG. 1, the semiconductor circuit includes a control signal generation circuit 110 and a reference voltage generation circuit 120. The semiconductor circuit may further include a bandgap reference circuit 130 for generating a first voltage VG_REF corresponding to a bandgap reference voltage that is insensitive to process, voltage, and temperature (PVT) characteristics.

The control signal generation circuit 110 is configured to generate control signals EN<1:n> in response to a voltage characteristic determination signal VCONTROLS. The voltage characteristic determination signal VCONTROLS may be a signal generated by an external input of a user or may be a signal of 2 bits or more which is outputted from a peripheral circuit (not shown) according to conditions. The number of control signals EN<1:n> may design dependent. As the number of control signals EN<1:n> is increased, the characteristic of a main reference voltage MAIN_REF can be more finely controlled.

In particular, the control signal generation circuit 110 may be formed of a decoder for asserting only one of the control signals EN<1:n> in response to the voltage characteristic determination signal VCONTROLS. In some embodiments, the control signal generation circuit 110 may include a plurality of fuses and may output the control signals EN<1:n> from which only one control signal is asserted, according to the cutting states of the fuses selected in response to the voltage characteristic determination signal VCONTROLS.

The reference voltage generation circuit 120 is configured to generate the main reference voltage MAIN_REF, having a first characteristic of being proportional to temperature (that is, characteristic having a PTAT component), a second characteristic that is constant and not related with temperature, and a third characteristic of being inversely proportional to temperature (that is, characteristic having a CTAT component), in response to the control signals EN<1:n>.

Figure 2:
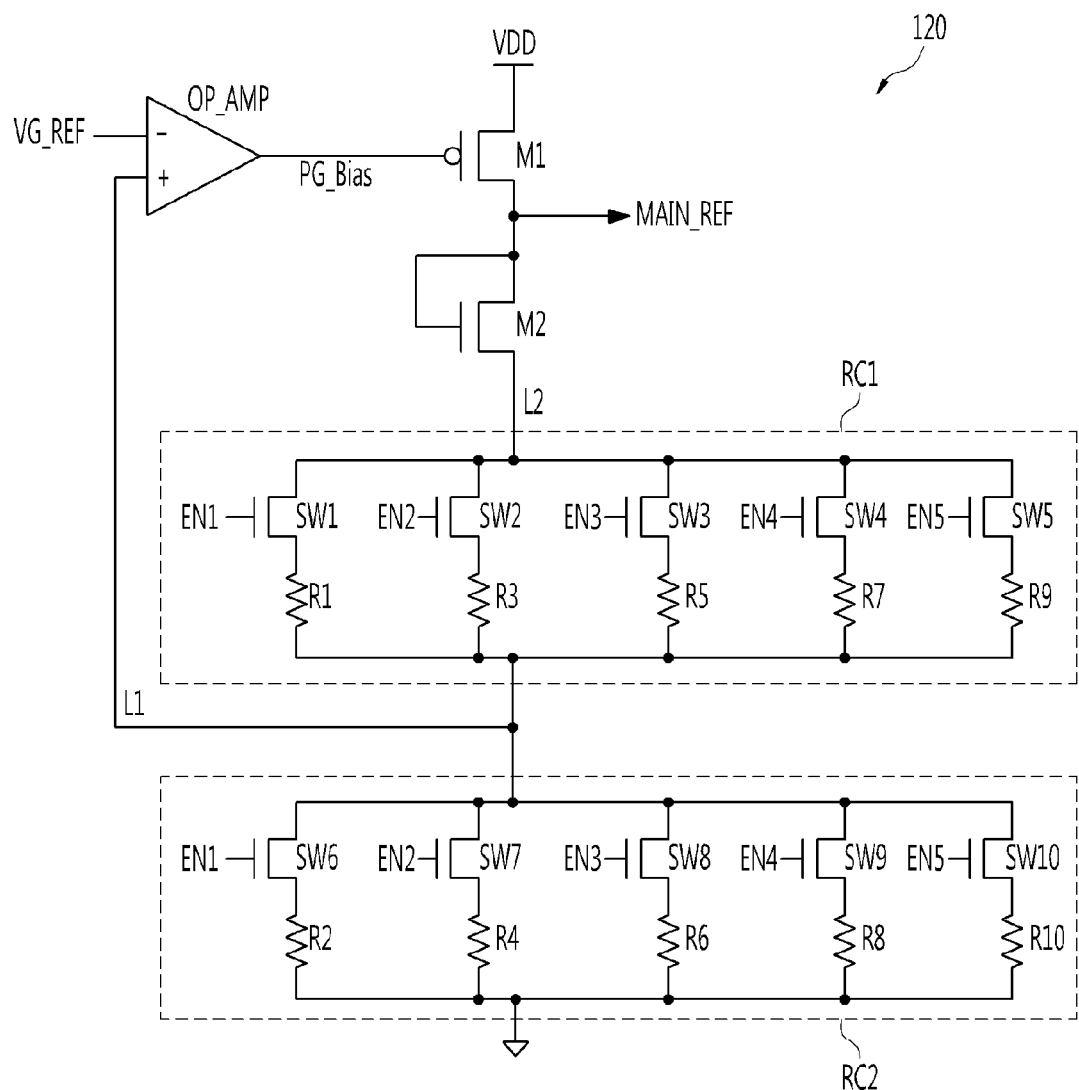
FIG. 2 is a circuit diagram illustrating an exemplary reference voltage generation circuit shown in FIG. 1.

FIG. 2 is a circuit diagram illustrating the reference voltage generation circuit 120 shown in FIG. 1.

Referring to FIG. 2, the reference voltage generation circuit 120 includes an op amp OP_AMP, a voltage supply circuit M1, and voltage characteristic determination circuits M2, RC1, and RC2.

The first voltage VG_REF is inputted to the inverting input terminal of the op amp OP_AMP, and the second voltage of a node L1 is inputted to the non-inverting input terminal of the op amp OP_AMP. The first voltage VG_REF may be used to generate a bandgap reference voltage that has a constant level irrespective of factors in a manufacturing process, a change in power source voltage, and a change in temperature. The voltage supply circuit M1 operates in response to a bias signal (or output voltage) PG_Bias outputted from the op amp OP_AMP and is coupled between a power source voltage terminal VDD and an output node from which the main reference voltage MAIN_REF is outputted. The voltage supply circuit M1 may be, for example, a PMOS transistor. The bias signal PG_Bias of the op amp OP_AMP is supplied to the gate of the PMOS transistor M1. The PMOS transistor M1 is coupled between the power source voltage terminal VDD and the output node that outputs the main reference voltage MAIN_REF.

The voltage characteristic determination circuits M2, RC1, and RC2 output at node L1 a second voltage that is inputted to the non-inverting input terminal of the op amp OP_AMP and determines a characteristic in response to the control signals EN<1:n> so that the main reference voltage MAIN_REF has one of the first characteristic of being proportional to temperature, the second characteristic of being constant and not related to temperature, and the third characteristic of being inversely proportional to temperature.

The voltage characteristic determination circuits include the diode M2, the first resistance circuit RC1, and the second resistance circuit RC2. The diode M2 is coupled to the output node that outputs the main reference voltage MAIN_REF. The diode M2 may be implemented using, for example, an NMOS diode-coupled transistor. That is, the gate and drain of the NMOS transistor are coupled to the output node, and the source is coupled to the first resistance circuit RC1.

The first resistance circuit RC1 is coupled between the diode M2 and the inverting input terminal of the op amp OP_AMP and is configured to have a varying resistance value in response to at least one of the control signals EN<1:n>. The first resistance circuit RC1 includes a plurality of switching circuits SW1 to SW5 and a plurality of resistors R1, R3, R5, R7, and R9. In this embodiment, there may be five control signals EN<1:5> where each control signal ENn controls one of the switching circuits SW1 to SW5.

More particularly, the switching circuits SW1 to SW5 are coupled in parallel, and in series with the diode M2. Each of the switching circuits SW1 to SW5 is selectively operated in response to the control signals EN<1:5>. Each of the resistors R1, R3, R5, R7, and R9 is coupled between its respective switching circuit SW1 to SW5 and the non-inverting input terminal of the op amp OP_AMP. Each of the resistors R1, R3, R5, R7, and R9 correspond to one of the switching circuits SW1 to SW5, and each of the switching circuits SW1 to SW5 is controlled by one of the control signals EN<1:5>. Furthermore, the resistors R1, R3, R5, R7, and R9 may each have different resistance values.

For example, the resistance value of the second resistor R3 may be half the resistance value of the first resistor R1, the resistance value of the third resistor R5 may be one-third of the resistance value of the first resistor R1, the resistance value of the fourth resistor R7 may be one-fourth of the resistance value of the first resistor R1, and the resistance value of the fifth resistor R9 may be one-fifth of the resistance value of the first resistor R1. Each of the switching circuits SW1 to SW5 is activated in response to assertion of its corresponding control signal ENn. The resistance value of the first resistance circuit RC1 is determined by a resistor coupled to the activated switching circuit.

The second resistance circuit RC2 is coupled between a ground terminal and the inverting input terminal of the op amp OP_AMP and is configured to have a varying resistance value in response to the control signals EN<1:n>. The second resistance circuit RC2 includes a plurality of switching circuits SW6 to SW10 and a plurality of resistors R2, R4, R6, R8, and R10, and operates in a similar manner to the first resistance circuit RC1.

More particularly, the switching circuits SW6 to SW10 are coupled in parallel to each other and each switching circuit is selectively operated in response to a corresponding one of the control signals EN<1:n>. The plurality of resistors R2, R4, R6, R8, and R10 is coupled between the respective switching circuits SW6 to SW10 and the ground terminal. Each of the resistors R2, R4, R6, R8, and R10 corresponds to one of the switching circuits SW6 to SW10, and each one of the switching circuits SW6 to SW10 is controlled by a corresponding one of the control signals EN<1:n>. Furthermore, the resistors R2, R4, R6, R8, and R10 may each have different resistance value.

For example, the resistance value of the seventh resistor R4 may be half the resistance value of the sixth resistor R2, the resistance value of the eighth resistor R6 may be one-third of the resistance value of the sixth resistor R2, the resistance value of the ninth resistor R8 may be one-fourth of the resistance value of the sixth resistor R2, and the resistance value of the tenth resistor R10 may be one-fifth of the resistance value of the sixth resistor R2. One of the switching circuits SW6 to SW10 is activated in response to assertion of its corresponding control signal ENn, and the resistance value of the second resistance circuit RC2 is determined by a resistor coupled to the activated switching circuit.

The resistance values of the first resistance circuit RC1 and the second resistance circuit RC2 may be increased or decreased in response to the control signals EN<1:n>.

If each of the resistance values of the first resistance circuit RC1 and the second resistance circuit RC2 is set to an intermediate resistance value, or a median resistance value, within a variable range in response to the control signals EN<1:n>, the reference voltage generation circuit 120 may be set to generate the main reference voltage MAIN_REF having the second characteristic that is constant and not related to temperature.

For example, when the third control signal EN3 of the control signals EN<1:n> is asserted, the resistance value of the first resistance circuit RC1 is the resistance value of the third resistor R5, and the resistance value of the second resistance circuit RC2 is the resistance value of the eighth resistor R6. Accordingly, the reference voltage generation circuit 120 outputs the main reference voltage MAIN_REF having the second characteristic of being constant and not related to temperature.

Furthermore, when each of the resistance values of the first resistance circuit RC1 and the second resistance circuit RC2 is set to be lower than an intermediate resistance value (that is, the resistance value of the third resistor R5 and the resistance value of the eighth resistor R6) within a variable range, the reference voltage generation circuit 120 outputs the main reference voltage MAIN_REF having the first characteristic of being proportional to temperature. In particular, as each of the resistance values of the first resistance circuit RC1 and the second resistance circuit RC2 becomes progressively lower than the intermediate resistance value, the main reference voltage MAIN_REF has a characteristic progressively shifting to a higher voltage range in proportion to temperature.

Furthermore, when each of the resistance values of the first resistance circuit RC1 and the second resistance circuit RC2 is set to be higher than the intermediate resistance value (that is, the resistance value of the third resistor R5 and the resistance value of the eighth resistor R6) within a variable range, the reference voltage generation circuit 120 outputs the main reference voltage MAIN_REF having the third characteristic inversely proportional to temperature. In particular, as each of the resistance values of the first resistance circuit RC1 and the second resistance circuit RC2 becomes progressively higher than the intermediate resistance value, the main reference voltage MAIN_REF has a characteristic progressively shifting more inversely in proportion to temperature.

For reference, when the third control signal EN3 is asserted, the main reference voltage MAIN_REF is determined by Equation 1 below.

$$\text{MAIN\_REF} = (1 + R5/R6) \times VG\_\text{REF} + Vgs\_M2 \text{ (}Vgs\_M2\text{: voltage between } M2 \text{ gate to } M2 \text{ source)} \quad \text{[Equation 1]}$$

The operation of the reference voltage generation circuit 120 is described in more detail.

Figure 3:
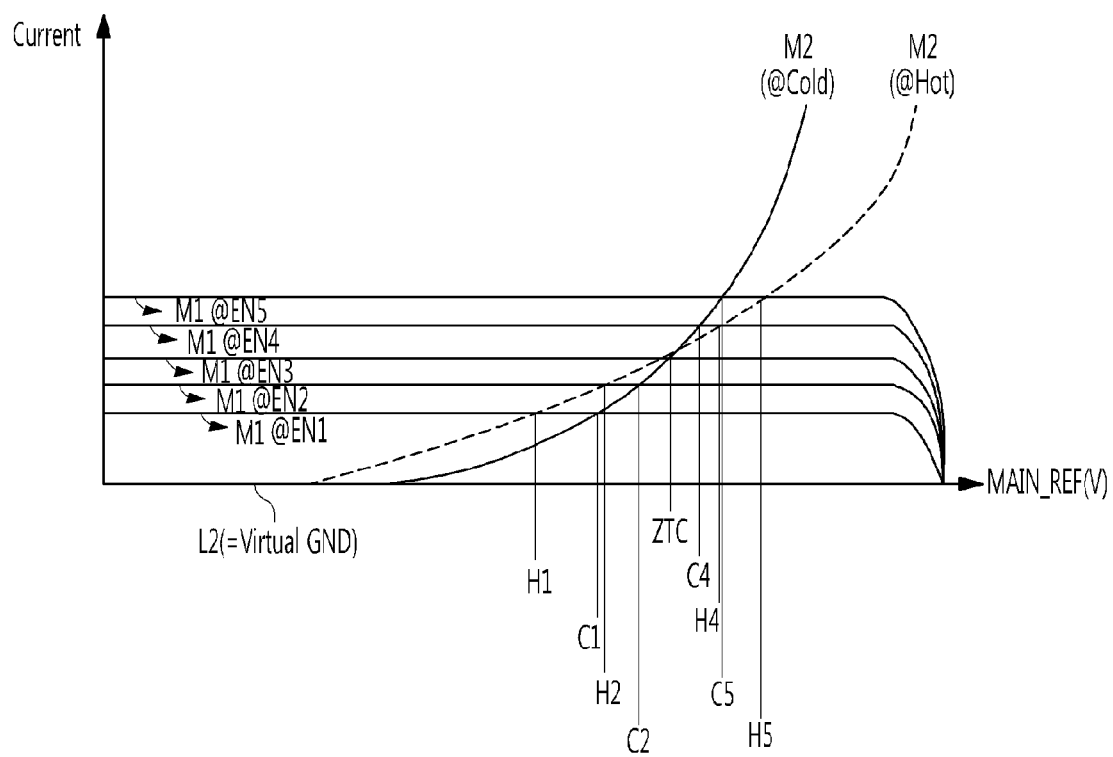
FIGS. 3 and 4 are characteristic graphs illustrating the operation of the reference voltage generation circuit.
Figure 4:
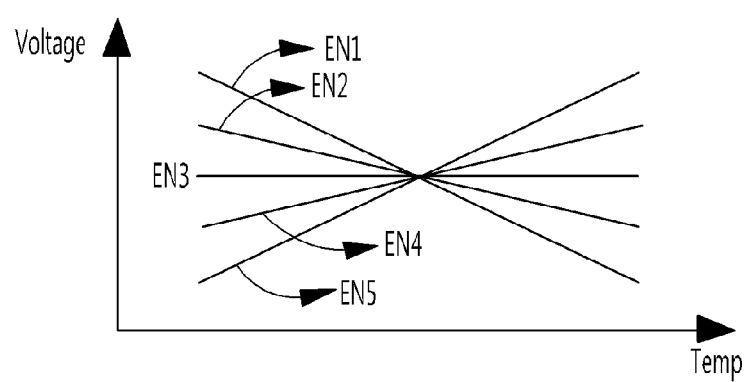

FIGS. 3 and 4 are characteristic graphs illustrating the operation of the reference voltage generation circuit 120.

Referring to FIGS. 2 to 4, the main reference voltage MAIN_REF is set in a level at which a graph, indicating the current characteristic of the PMOS transistor M1 of the voltage supply circuit 120, crosses a graph indicating the current characteristic of the diode M2. When the third control signal EN3 is activated, the resistance value of the first resistance circuit RC1 becomes the resistance value of the third resistor R5 and the resistance value of the second resistance circuit RC2 becomes the resistance value of the eighth resistor R6.

The main reference voltage MAIN_REF having a zero temperature coefficient ZTC is outputted at a point where the graph, indicating the current characteristic of the PMOS transistor M1 of the voltage supply circuit 120, meets the graph indicating the current characteristic of the diode M. That is, when the third control signal EN3 is asserted, the main reference voltage MAIN_REF is outputted at a constant level irrespective of change in temperature.

Furthermore, when the fourth control signal EN4 is activated, the resistance value of the first resistance circuit RC1 becomes the resistance value of the fourth resistor R7 and the resistance value of the second resistance circuit RC2 becomes the resistance value of the ninth resistor R8. Here, the main reference voltage MAIN_REF is changed in proportion to temperature between C4 and H4.

Furthermore, when the fifth control signal EN4 is activated, the resistance value of the first resistance circuit RC1 becomes the resistance value of the fifth resistor R9 and the resistance value of the second resistance circuit RC2 becomes the resistance value of the tenth resistor R10. The main reference voltage MAIN_REF is changed in proportion to temperature between C5 and H5. That is, a change of the main reference voltage MAIN_REF is shifted higher in proportion to a change in temperature.

On the other hand, when the second control signal EN2 is asserted, the resistance value of the first resistance circuit RC1 becomes the resistance value of the second resistor R3 and the resistance value of the second resistance circuit RC2 becomes the resistance value of the seventh resistor R4. The main reference voltage MAIN_REF is changed in inverse proportion to temperature between C2 and H2.

Furthermore, when the first control signal EN1 is activated, the resistance value of the first resistance circuit RC1 becomes the resistance value of the first resistor R1 and the resistance value of the second resistance circuit RC2 becomes the resistance value of the sixth resistor R2. The main reference voltage MAIN_REF is shifted lower in inverse proportion to temperature between C1 and H1. That is, a change of the main reference voltage MAIN_REF is increased in more inverse proportion to a change in temperature.

More particularly, when the first control signal EN1 is activated, the main reference voltage MAIN_REF is determined by Equation 2 below according to a ratio of the first resistor R1 and the sixth resistor R2.

$$\text{MAIN\_REF} = (1 + R1/R2) \times VG\_\text{REF} + Vgs\_M2 \text{ (}Vgs\_M2\text{: voltage from } M2 \text{ gate to } M2 \text{ source)} \quad \text{[Equation 2]}$$

Current flowing through the resistor is determined as a value obtained by dividing the voltage of the node L1 by the resistance value of the sixth resistor R2, and voltage at the node L2 of the diode M2 and the first resistance circuit RC1 remains intact. In this case, the main reference voltage MAIN_REF is determined at the crossing point of graphs, indicating the current characteristics of the transistor M1 and the diode M2.

That is, the main reference voltage MAIN_REF is determined in the level H1 at high temperature, and the main reference voltage MAIN_REF is determined in the level C1 at low temperature. Accordingly, the main reference voltage MAIN_REF has the CTAT component.

When the second control signal EN2 is asserted, the voltage of the node L2 is constant according to a ratio of the second resistor R3 and the seventh resistor R4, but current is changed according to the voltage of the node L1 of the first and the second resistance circuits RC1 and RC2 and the resistances of the resistors R3 and R4. Accordingly, current flowing through the resistors R3 and R4 is increased.

For this purpose, current flowing through the transistor M1 is increased, and the output voltage PG_Bias of the op amp OP_AMP is decreased. Consequently, the main reference voltage MAIN_REF is determined in the level H2 at high temperature, the main reference voltage MAIN_REF is determined in the level C2 at low temperature, and the CTAT component of the main reference voltage MAIN_REF is decreased.

When the fifth control signal EN5 is asserted, the voltage of the node L2 is constant according to a ratio of the second resistor R3 and the seventh resistor R4, but current is changed according to voltage at the node L1 of the first and the second resistance circuits RC1 and RC2 and the resistances of the resistors R9 and R1. Accordingly, current flowing through the resistors R9 and R10 is further increased.

For this purpose, current flowing through the transistor M1 is further increased, and the output voltage PG_Bias of the op amp OP_AMP is further decreased. Consequently, the main reference voltage MAIN_REF is determined in the level H5 higher than the ZTC level at high temperature, the main reference voltage MAIN_REF is determined at the level C5 higher than the ZTC level at low temperature, and the main reference voltage MAIN_REF has the PTAT component.

As in the construction and operation of the semiconductor circuit described above, the semiconductor circuit can output the main reference voltage MAIN_REF, that is one of proportional to temperature, constant with temperature, and inversely proportion to temperature, in response to the control signals EN<1:n>.

According to an exemplary embodiment of the invention, the reference voltage generation circuit outputs one of a reference voltage not related with temperature, a reference voltage having a PTAT component, and a reference voltage having a CTAT component. Accordingly, a variety of reference voltages can be generated, and an increase of the area occupied by the reference voltage generation circuit can be prevented.

While the resistance circuits were described as comprising five branches, where each branch comprised a switching device and a resistive device, the invention need not be so limited. Various embodiments of the invention may comprise different number of branches. Furthermore, the switching device may be implemented using any of various methods for electrically isolating a circuit, and the resistive device may be implemented in various ways, including using semiconductor devices if applicable.

What is claimed:

1. A semiconductor circuit, comprising:
    a bandgap reference circuit configured to generate a first voltage constant irrespective of temperature;
    an amplifier circuit configured to generate a bias signal based on the first voltage and a division voltage;
    a transfer circuit configured to transfer a power source voltage to an output terminal in response to the bias signal;
    a diode circuit between the output terminal and a first node; and
    first and second resistance circuits coupled in series between the first node and a ground node, wherein each resistance circuit is configured to have its resistance value varied in response to control signals in order to control current flowing through the transfer circuit.

2. The semiconductor circuit of claim 1, wherein the division voltage is outputted from a coupling node of the first and second resistance circuits.

3. The semiconductor circuit of claim 1, wherein the first resistance circuit comprises:
    a first plurality of switching circuits coupled in parallel and configured to selectively operate in response to the control signals; and
    a first plurality of resistors coupled between the coupling node and the first plurality of switching circuits,
    wherein each of the first plurality of resistors has a different resistance value.

4. The semiconductor circuit of claim 1, wherein the second resistance circuit comprises:
    a second plurality of switching circuits coupled in parallel and configured to selectively operate in response to the control signals; and
    a second plurality of resistors coupled between the ground node and the first plurality of switching circuits,
    wherein each of the first plurality of resistors has a different resistance value.

5. The semiconductor circuit of claim 1, wherein when each of resistance values of the first resistance circuit and the second resistance circuit is set to a median resistance value within a variable range, a main reference voltage constant irrespective of temperature is outputted to the output terminal.

6. The semiconductor circuit of claim 1, wherein when each of resistance values of the first resistance circuit and the second resistance circuit is set to a resistance value lower than a median resistance value within a variable range, a main reference voltage proportional to temperature is outputted to the output terminal.

7. The semiconductor circuit of claim 1, wherein when each of resistance values of the first resistance circuit and the second resistance circuit is set to a resistance value higher than a median resistance value within a variable range, a main reference voltage inversely proportional to temperature is outputted to the output terminal.

8. A semiconductor circuit, comprising:
    a bandgap reference circuit configured to generate a bandgap reference voltage constant irrespective of temperature;
    a control signal generation circuit configured to generate control signals in response to a voltage characteristic determination signal; and
    a reference voltage generation circuit configured to output a main reference voltage having one of a first characteristic of being proportional to temperature, a second characteristic of being constant irrespective of temperature, and a third characteristic of being inversely proportional to temperature, in response to the control signals and the bandgap reference voltage.

9. The semiconductor circuit of claim 8, wherein the reference voltage generation circuit comprises: an amplifier circuit configured to have the bandgap reference voltage inputted to an inverting input terminal; a transistor circuit coupled between a power source voltage terminal and an output node from which the main reference voltage is outputted and which is configured to operate in response to an output voltage of the amplifier circuit; a diode circuit coupled to the output node; a first resistance circuit coupled between the diode circuit and a non-inverting input terminal of the amplifier circuit and configured to have a resistance value varying in response to the control signals; and a second resistance circuit coupled between a ground terminal and the non-inverting input terminal of the amplifier circuit and configured to have a resistance value varying in response to the control signals.

10. The semiconductor circuit of claim 9, wherein the transistor circuit comprises a PMOS transistor.

11. The semiconductor circuit of claim 9, wherein the diode circuit is an NMOS transistor having a gate and a drain coupled to the output node and a source coupled to the first resistance circuit.

12. The semiconductor circuit of claim 9, wherein the first resistance circuit comprises: first to fifth switching circuits coupled in parallel and configured to selectively operate in response to the control signals; and first to fifth resistors coupled between a non-inverting input terminal of the amplifier circuit and the first to fifth switching circuits, respectively.

13. The semiconductor circuit of claim 9, wherein the second resistance circuit comprises: sixth to tenth switching circuits coupled in parallel and configured to selectively operate in response to the control signals; and sixth to tenth resistors coupled between the ground terminal and the sixth to tenth switching circuits, respectively.

14. The semiconductor circuit of claim 9, wherein when each of resistance values of the first resistance circuit and the second resistance circuit is set to a median resistance value within a variable range, the reference voltage generation circuit generates the main reference voltage having the second characteristic of being constant irrespective of the temperature.

15. The semiconductor circuit of claim 9, wherein when each of resistance values of the first resistance circuit and the second resistance circuit is set to a resistance value lower than a median resistance value within a variable range, the reference voltage generation circuit generates the main reference voltage having the first characteristic of being proportional to temperature.

16. The semiconductor circuit of claim 15, wherein as each of the resistance values the first resistance circuit and the second resistance circuit becomes progressively lower than the median resistance value, the main reference voltage has a characteristic of shifting to a higher temperature range in proportion to temperature.

17. The semiconductor circuit of claim 9, wherein when each of resistance values of the first resistance circuit and the second resistance circuit is set to a resistance value higher than a median resistance value within a variable range, the reference voltage generation circuit generates the main reference voltage having the third characteristic of being inversely proportional to the temperature.

18. The semiconductor circuit of claim 17, wherein as each of the resistance values of the first resistance circuit and the second resistance circuit becomes higher than the median resistance value, the main reference voltage has a characteristic of shifting to a lower temperature range in inverse proportion to temperature.

19. The semiconductor circuit of claim 8, wherein the reference voltage generation circuit comprises: an op amp configured to have a first voltage inputted to an inverting input terminal and a second voltage inputted to a non-inverting input terminal; a voltage supply circuit configured to operate in response to an output voltage of the op amp and coupled between a power source voltage terminal and an output node from which the main reference voltage is outputted; and a voltage characteristic determination circuit unit configured to output the second voltage to determine a characteristic of the main reference voltage as one of the first to third characteristics in response to the control signals.

20. The semiconductor circuit of claim 19, wherein the voltage supply circuit comprises a PMOS transistor coupled between the power source voltage terminal and the output node, wherein the output voltage of the op amp is inputted to a gate of the PMOS transistor.

21. The semiconductor circuit of claim 19, wherein the voltage characteristic determination circuit comprises: a diode coupled to the output node; a first resistance circuit coupled between the diode and a non-inverting input terminal of the op amp and configured to have a resistance value varying in response to the control signals; and a second resistance circuit coupled between a ground terminal and the non-inverting input terminal of the op amp and configured to have a resistance value varying in response to the control signals.

22. The semiconductor circuit of claim 21, wherein the diode is an NMOS transistor having a gate and a drain coupled to the output node and a source coupled to the first resistance circuit.

23. The semiconductor circuit of claim 21, wherein the first resistance circuit comprises: first to fifth switching circuits coupled in parallel and configured to selectively operate in response to the control signals; and first to fifth resistors coupled between the non-inverting input terminal of the op amp and the first to fifth switching circuits, respectively.

24. The semiconductor circuit of claim 21, wherein the second resistance circuit comprises: sixth to tenth switching circuits coupled in parallel and configured to selectively operate in response to the control signals; and sixth to tenth resistors coupled between the ground terminal and the sixth to tenth switching circuits, respectively.

25. The semiconductor circuit of claim 21, wherein when each of resistance values of the first resistance circuit and the second resistance circuit is set to a median resistance value within a variable range, the reference voltage generation circuit generates the main reference voltage having the second characteristic of being constant irrespective of the temperature.

26. The semiconductor circuit of claim 21, wherein when each of resistance values of the first resistance circuit and the second resistance circuit is set to a resistance value lower than a median resistance value within a variable range, the reference voltage generation circuit generates the main reference voltage having the first characteristic of being proportional to temperature.

27. The semiconductor circuit of claim 26, wherein as each of the resistance values of the first resistance circuit and the second resistance circuit becomes progressively lower than the median resistance value, the main reference voltage has a characteristic of progressively shifting to a higher voltage range in proportion to temperature.

28. The semiconductor circuit of claim 21, wherein when each of resistance values of the first resistance circuit and the second resistance circuit is set to a resistance value higher than a median resistance value within a variable range, the reference voltage generation circuit generates the main reference voltage having the third characteristic of being inversely proportional to temperature.

29. The semiconductor circuit of claim 28, wherein as each of the resistance values the first resistance circuit and the second resistance circuit becomes progressively higher than the median resistance value, the main reference voltage has a characteristic of progressively shifting to a lower voltage range in inverse proportion to temperature.

* * * * *